United States Patent [19]
Wilson

[11] Patent Number: 6,067,610
[45] Date of Patent: *May 23, 2000

[54] METHOD AND DATA PROCESSOR FOR SYNCHRONIZING MULTIPLE MASTERS USING MULTI-BIT SYNCHRONIZATION INDICATORS

[75] Inventor: Glen E. Wilson, Austin, Tex.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/688,633

[22] Filed: Jul. 29, 1996

[51] Int. Cl.[7] .................................................. G06F 9/00
[52] U.S. Cl. ........................ 712/21; 709/205; 709/400
[58] Field of Search .......................... 395/553, 800.21, 395/800.1; 371/21, 200.35; 712/21, 10; 709/400, 205

[56] References Cited

U.S. PATENT DOCUMENTS

| | | | |
|---|---|---|---|
| 4,967,326 | 10/1990 | May | 395/800.21 |
| 4,989,131 | 1/1991 | Stone | 395/379 |
| 5,222,229 | 6/1993 | Fukuda et al. | 395/553 |
| 5,226,127 | 7/1993 | Fu et al. | 395/584 |
| 5,315,701 | 5/1994 | DiNicola et al. | 34/502 |
| 5,519,877 | 5/1996 | Yoneda et al. | 395/553 |
| 5,574,849 | 11/1996 | Sonnier et al. | 395/182.1 |
| 5,594,741 | 1/1997 | Kinzelman et al. | 371/21 |
| 5,634,071 | 5/1997 | Dewa et al. | 395/800.13 |

Primary Examiner—Meng-Ai T. An
Assistant Examiner—Gautam R. Patel

[57] ABSTRACT

A method and apparatus for syncing multiple bus masters (110, 120, 130, 140) utilize a sync bus (160) to communicate synchronization information between a plurality of bus masters. For each bus master, a check is made after instruction fetch (350) for a "sync indicator" (360). When a sync indicator is detected (360), the bus master transmits sync signals on the sync bus (160) indicating which masters it needs to sync with (365). The bus master then stalls instruction dispatch (390) until the corresponding sync signals are received (370) on the sync bus (160) from the other bus masters. A further programmed delay may be introduced after the bus masters have matched sync signals (375), enabling through testing for timing windows.

6 Claims, 7 Drawing Sheets

| $S_{FIELD}$ P1 | | | |
|---|---|---|---|
| P1 | P2 | P3 | |
| 1 | 1 | 1 | SYNC ALL |
| 1 | 1 | 0 | SYNC TO P2 |
| 1 | 0 | 1 | SYNC TO P3 |
| 1 | 0 | 0 | INVALID/NOT SYNCHED |
| 0 | X | X | NOT SYNCHED |

*FIG. 5*

| $S_{FIELD}$ P2 | | | |
|---|---|---|---|
| P1 | P2 | P3 | |
| 1 | 1 | 1 | SYNC ALL |
| 1 | 1 | 0 | SYNC TO P1 |
| 0 | 1 | 1 | SYNC TO P3 |
| 0 | 1 | 0 | INVALID/NOT SYNCHED |
| X | 0 | X | NOT SYNCHED |

*FIG. 6*

METHOD AND DATA PROCESSOR FOR SYNCHRONIZING MULTIPLE MASTERS USING MULTI-BIT SYNCHRONIZATION INDICATORS

FIELD OF THE INVENTION

Generally, the present invention relates to microprocessors. Specifically, the present invention relates to syncing instructions between multiple bus masters in a microprocessor system.

BACKGROUND OF THE INVENTION

In the semiconductor arts, it is necessary to perform functional testing on semiconductor devices in order to assure their correct operation. One goal of a functional testing environment is to fully exercise a Device Under Test (DUT.). Some of the most difficult types of transactions associated with a functional test are those having a timing dependency. One example of a timing dependency occurs in systems that have multiple bus masters where both bus masters are attempting to access a single resource at the same time. In order to control signal timing to a DUT, testing schemes have been developed to control which bus master is attempting to access the external resource.

Prior Art FIG. 1 illustrates a system where two bus masters, labeled P1 and P2, can access a DUT at the same time. In the prior art, a bus controller can be used to interact with the masters such that their accesses can be limited. Prior art implementations of the type illustrated in FIG. 1 require the bus controller to interface to the specific bus protocol of the master P1, as well as the master P2. Often, different masters have different protocols, and the bus controller requires additional complexity to account for the differences between various bus masters.

Once a prior art bus controller has been implemented, it monitors the bus waiting for a specific event to occur. An example of one such event would be a write to a specific address. This would be recognized by the bus controller as it monitors the bus master P1. Once the event is recognized by the bus controller, the bus controller asserts control over the master P1 to effectively freezing master P1 from completing the bus cycle of the current or a subsequent instruction. In a similar manner, the bus controller can monitor and control the bus associated with the bus master P2.

Once the bus controller has both processor buses monitored under its control, it would be capable of releasing buses at various times in order to simulate possible system timing situations. Because the prior art bus controller freeze the bus, other bus activity cannot occur while under the control of the bus controller. Therefore, while specific timing may be applied, it is not possible for other system activities to occur.

A need, therefore, exists for a common control mechanism to synchronize the activity of multiple masters that allows the masters to operate in a normal condition during the synching operation.

BRIEF DESCRIPTION OF THE DRAWINGS

FIG. 5 is a table containing synchronization bit values for a bus master, in accordance with the present invention;

FIG. 6 is a table containing synchronization bit values for a bus master, in accordance with the present invention;

DETAILED DESCRIPTION OF PREFERRED EMBODIMENTS

In the following description, numerous specific details are set forth such as specific word or byte lengths, etc. to provide a thorough understanding of the present invention. However, it will be obvious to those skilled in the art that the present invention may be practiced without such specific details. In other instances, circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

The term "bus" will be used to refer to a plurality of signals or conductors which may be used to transfer one or more various types of information, such as data, addresses, control, or status. The terms "assert" and "negate" will be used when referring to the rendering of a signal, status bit, or similar apparatus into its logically true or logically false state, respectively. If the logically true state is a logic level one, the logically false state will be a logic level zero. And if the logically true state is a logic level zero, the logically false state will be a logic level one.

The present invention allows each bus master in a system to present synchronization (sync) request information to each other master in the system. Once a sync request is issued by a first bus master, it will stall execution of instructions to the first bus master execution unit until it receives matching sync request information from each master to which synchronization is desired. Once all desired masters indicate similar sync requests, the instruction stall is removed, allowing instructions to execute. In this manner, synchronization is actually controlled by the master, not an external device. This allows either hardware or software associated with the master to control the synchronization process.

Figure 2:
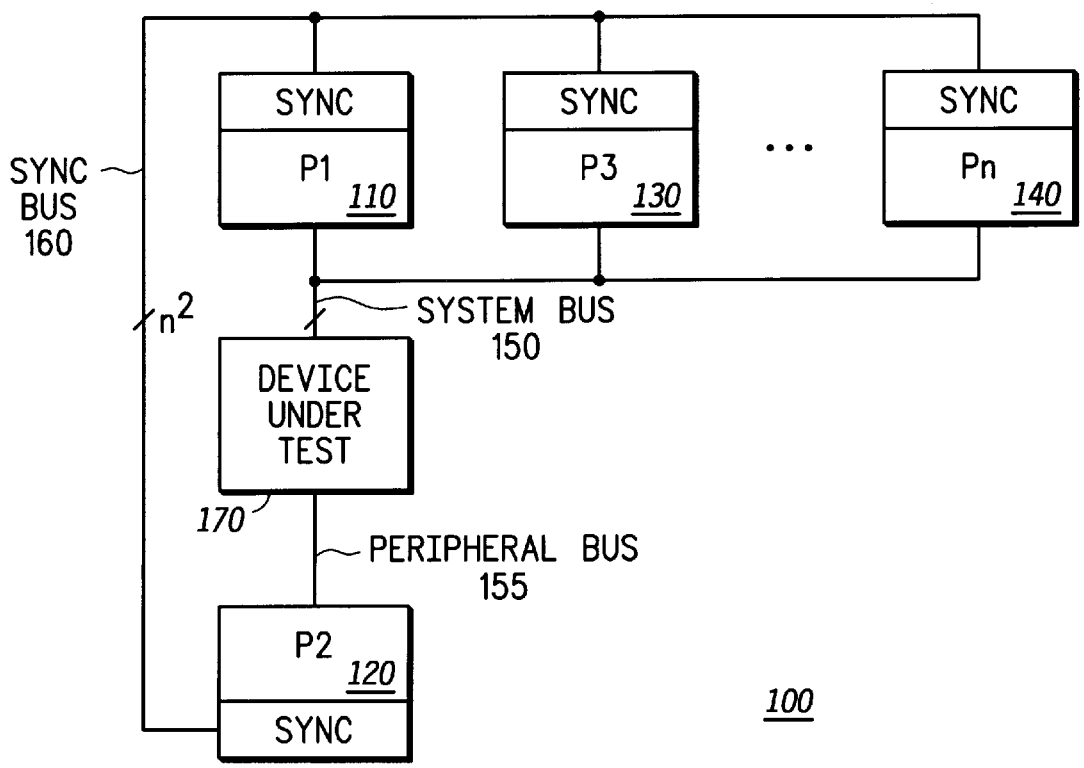
FIG. 2 is a block diagram illustrating a system 100 utilizing a synchronous mechanism in accordance with the present invention.

FIG. 2 illustrates a system 100 with multiple bus masters. The system 100 comprises bus master P1 110, bus master P2 120, bus master P3 130, bus master Pn 140, and device under test (DUT) 170. Bus master P1 110, P3 130, and Pn 140 are all connected to the DUT 170 via system bus 150. Bus master P2 120 is connected to the DUT 170 through peripheral bus 155. The bus masters P1 110, P2 120, P3 130 through Pn 140, are connected to each other through a common sync bus 160.

In operation, bus masters P1 110 and P3 130 through Pn 140, which share a common system bus 150, would be arbitrated by an external arbiter (not shown). The external arbiter would specify the control order over the bus among bus masters P1 110 and P3 130 through Pn 140. In another embodiment, the arbiter could actually be the desired function performed by a device under test (DUT) 170.

The control of the system bus 150 under normal operations, would be controlled by one of the bus masters P1 110 or P3 130 through Pn 140. The device under test 170 would represent a component which can be accessed by the system bus 150. In addition, a device under test 170 is also accessed by the peripheral bus 155. The peripheral bus 155, in the embodiment shown, would always be controlled by bus master P2 120. Note that bus master P2 120 could share the peripheral bus 155 with other bus master elements and require the use of an external arbiter, or possibly an arbiter also incorporated within the device under test 170. In addition, peripheral bus 155 could be a separate but identical bus to system bus 150.

In this configuration, the device under test (DUT) 170 recognizes the events that occur on both the system bus 150 and the peripheral bus 155. The device under test 170, in a preferred embodiment, would be an element capable of performing bus coordination functions as would be associated in one embodiment with a PCI bridge set, as would be manufactured by a semiconductor manufacturer, such as Motorola Inc.'s MPC106. In this environment, the device under test 170 would be responsible for coordinating activities between system bus 150 and peripheral bus 155.

In order to functionally test the DUT 170, it would be necessary to control the sequencing of events on system bus 150, as related to peripheral bus 155, such that the timing specifications of the device under test 170 could be verified. For example, if the device under test 170 needs to simultaneously handle an event from system bus 150 and peripheral bus 155, it is necessary to control those events on the respective buses such that the two events happen in a simultaneous manner. Conversely, if a first event on system bus 150, must happen a specified amount of time before a second event on peripheral bus 155 an environment which allows control over the respective event timings on system bus 150 relative to peripheral bus 155 is necessary in order to assure to ensure functionality.

Therefore, in order to fully test the timing dependencies, the relevant timing relationships among events must be varied relative to each other in order to cover a broad range of possibilities. The process of completely varying timing signals relative to each other is known as a schmoo. This indicates that the signals are completely varied relative to each other within a given time period. The prior art method of creating a schmoo was accomplished by directly controlling the buses or signals going to the device under test. While that method is capable of controlling precise timings to the device under test, it can also mask the real behavior of the buses and the master devices.

For example, if bus master P1 110 had control of the bus and issued an event which needed to be handled by the device under test 170, the prior art mechanism would identify the requested event as requiring some specified timing modification and freeze the bus master P1 bus. By freezing the bus master P1 110, no other bus events would be able to be monitored by the bus master P1 110. In addition, depending on the implementation, the actual ability of bus masters P3 130 through Pn 140 to form other functions may also be modified. In the prior art, once the bus of master P1 110 has been frozen by a bus controller, the bus will remain frozen until some timing criteria is met. If the criteria includes an event on the peripheral bus 155, the bus controller would release the system bus P1 110 at an appropriate time to implement the timing criteria for the two events.

Figure 1:
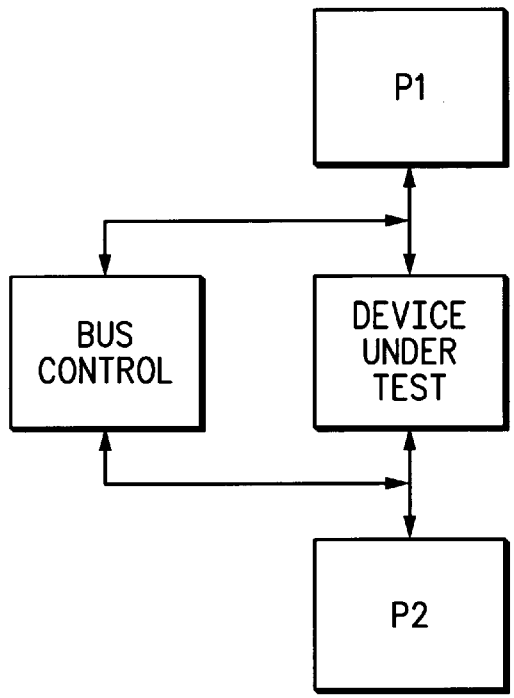
FIG. 1 is a block diagram illustrating a prior art configuration of two bus masters with a Device Under Test (DUT)

In a preferred embodiment, as illustrated in FIG. 1, a system multiple bus masters would have a sync bus 160 connecting the bus masters together. For a system with a small number of bus masters in such a preferred embodiment, each master would have N bits, or signals, dedicated to it for transmitting a sync request signal, where N is the number of bus masters in the system. This would require a sync bus 160 having a size of $N^2$. In the present embodiment, N is equal to 3. Therefore, the sync bus 160 would have 9 bits associated with it, requiring 9 separate connections to each bus master. Note that the present invention is not limited by the type of sync bus connecting the individual bus masters together. In a system having a small number of bus masters, a sync bus have a size of $N^2$ is preferred because of implementation simplicity. Larger bus sizes could implement any of a large number of asynchronous or synchronous busses. One advantage of using a bus having $N^2$ bits, for reasonably small N, is that specifically arbitration and other protocol concerns do not need to be addressed where the bus size is $N^2$. Allowing each of the bus masters to both assert and monitor the sync bus in such a fashion allows the current sync status of each bus master to be known by each of the other bus masters.

Figure 3:
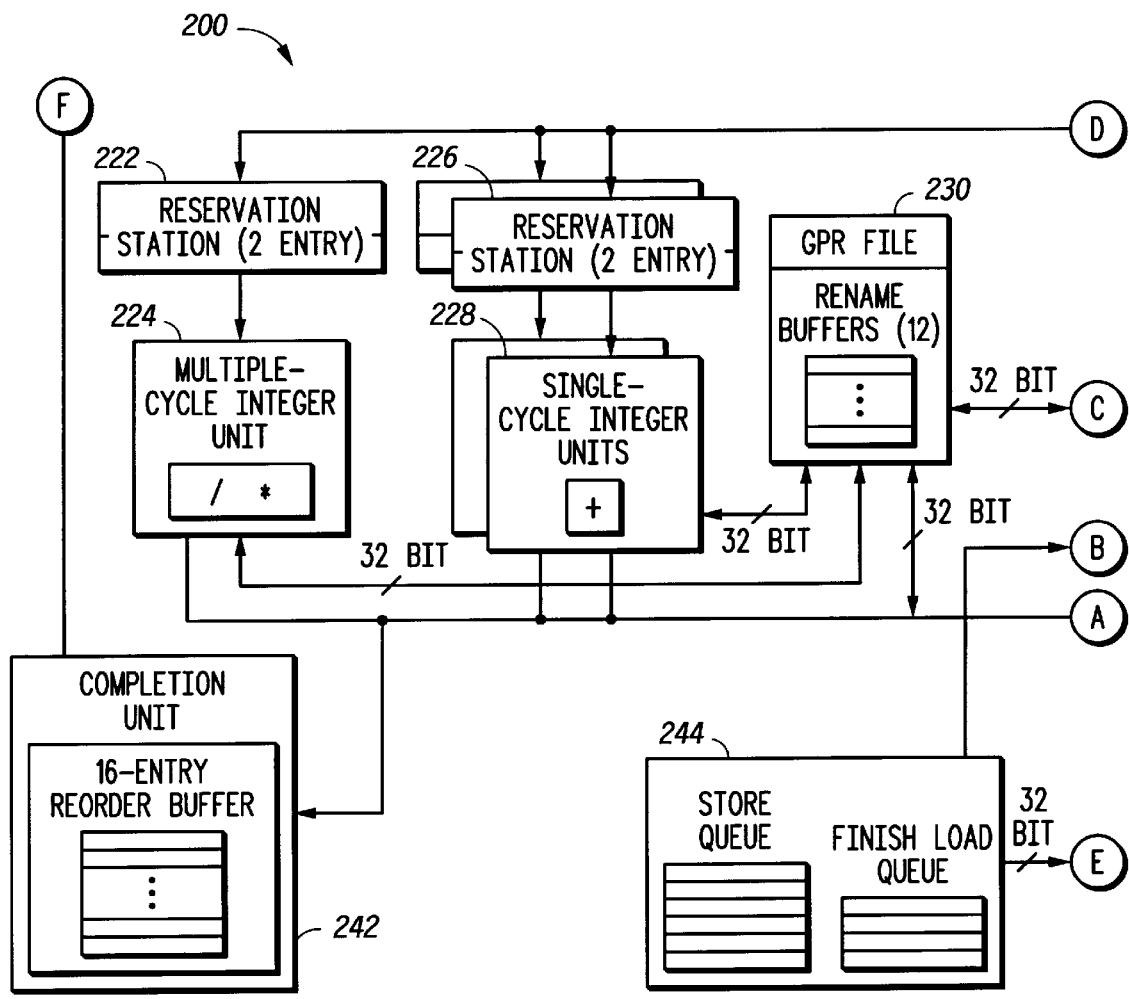
FIGS. 3 and 4 are block diagrams that together illustrate a microprocessor 200 implementing the synchronous implementation of the present invention.
Figure 4:
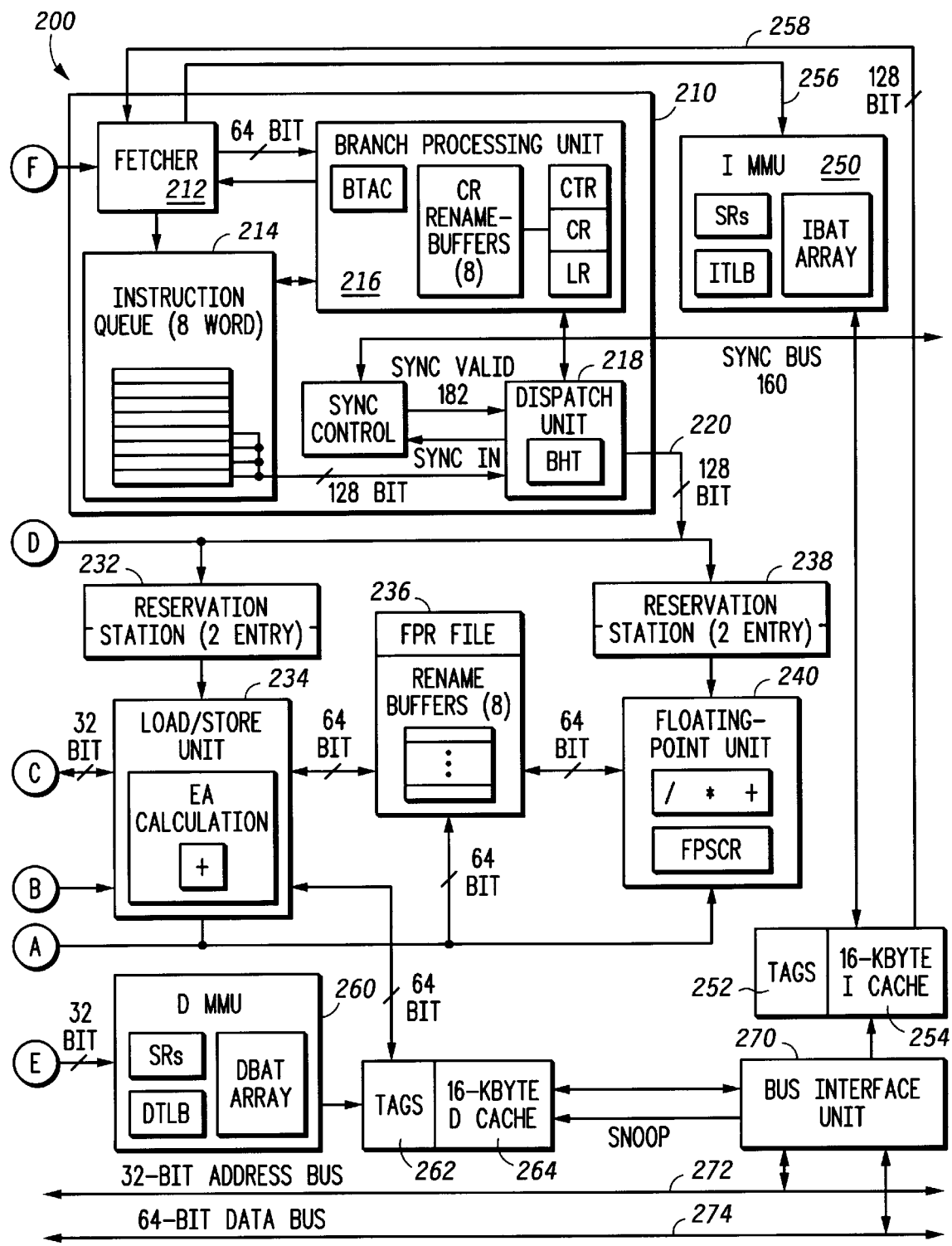

FIG. 3 and FIG. 4 illustrate a microprocessor 200 in accordance with the present invention. Microprocessor 200 illustrates a PowerPC™ microprocessor of the type produced by Motorola, Inc. Microprocessor 200 incorporates a block 210 which includes a fetcher 212 for receiving instructions from a memory sub-system, a branch processing unit 216 for processing branch instructions fetched by fetcher 212, and instruction queue 214 for holding instructions acquired by fetcher 212. The instructions in instruction queue 214 may or may not have been decoded. In either case, they represent instructions which have not been either dispatched or retired. In addition, block 210 includes a synchronization (sync) control block 180. The sync control block 180 receives a "sync-in" signal 181 from dispatch unit 218, and provides a "sync-out" signal 182 to dispatch unit 218. Sync control block 180 receives the synchronization signals from sync bus 160.

In operation, when the sync value being monitored on the sync bus 160 matches the value received from dispatch unit 218, sync control block 180 provides a sync-out signal 182 to the dispatch unit 218 which in response will dispatch the current instruction. This is best understood with reference to FIGS. 5, 6, and 7. FIG. 5 illustrates a table containing possible sync values for output on sync bus 160 by master P1. Master P1 has three of the nine bits of the sync bus allocated for sending of its sync information.

As illustrated in the table of FIG. 5, a value of b'111' in the master P1 portion of the sync bus 160 indicates that master P1 wants to be synced with both masters P2 and masters P3. ('b' is used here to indicate a binary number). Each bit represents one of the N bus masters in the system. By sending an active bit, a one (b'1') bit in this example, the sending master is requesting to be synced to the master corresponding to that location.

If the P1 portion of the sync bus 160 contains the value b'110', the master P1 would be requesting synchronization to peripheral P2 only, as illustrated in the second line of table of FIG. 5. This value would be transmitted by master P1 to all other masters. Conversely, a code of b'101' would indicate that bus master P1 expects to be synced only to bus master P3. A value of b'100' by master P1 would either be an invalid value (because it indicates that P1 needs to sync with itself), or a "not synced" indicator. A bus master sending a zero value out in its own relative bit field indicates that the bus master sending the data is not synced to any other master.

The table in FIG. 6 indicates sync bus bit values for bus master P2. As discussed previously, bus master P1 has three dedicated bits for sending its sync information, as does bus masters P2 and P3. The bit information transmitted on sync bus 160 by any given master is received by each of the other masters. The received information is compared to the transmitted information to determine when a synchronization has occurred. For example, master P1 would transmit a value of b'110', if a synchronization with P2 is required. Until master P2 also transmits a value of b'110', master P1 will stall issuance of any further instructions to its execution unit. Once a value of b'110' has been received by P1 from P2, execution of code will resume in master P1. A sync code of b'111' would require a value of b'111' be received from masters P2 and P3, before master P1 would resume executing instructions after being stalled.

Figure 7:
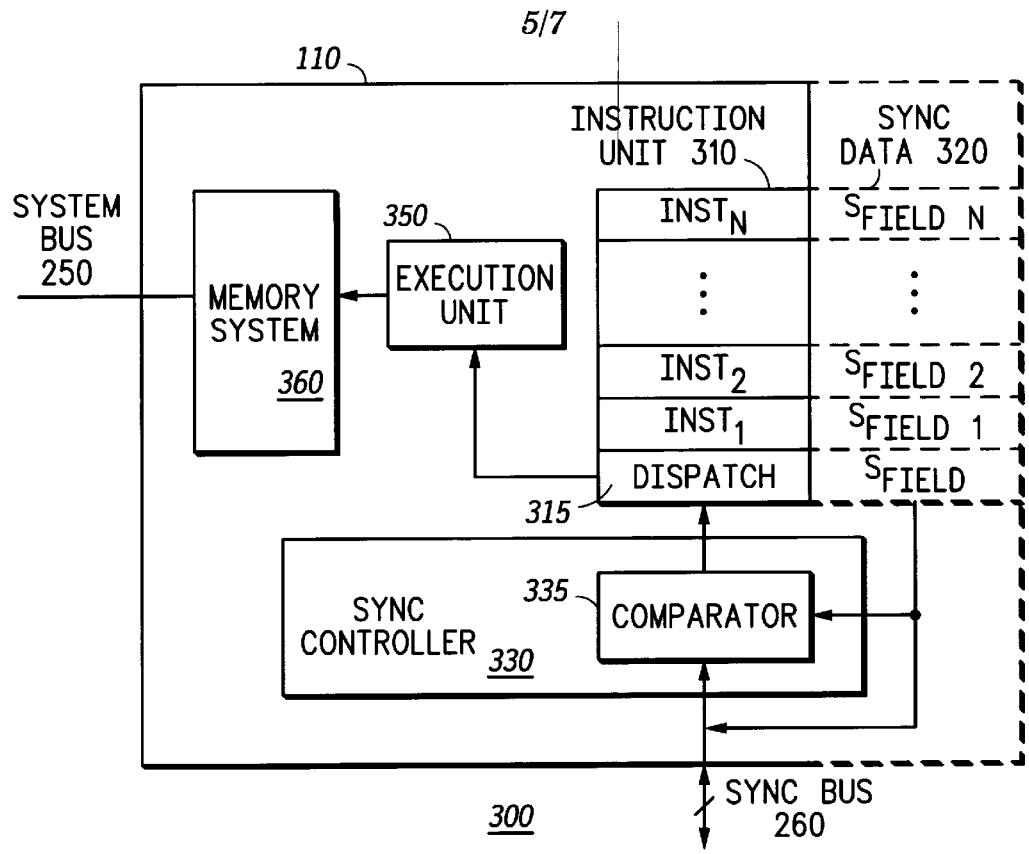
FIG. 7 is a block diagram illustrating a portion of the microprocessor system of FIG. 4.

FIG. 7 illustrates a portion of the MPU of FIGS. 3 and 4. For purposes of discussion, FIG. 7 also illustrates a portion of master M1 of FIG. 2. Instructions to be executed are maintained in an instruction queue 214. Each instruction (INST) has associated with it a Synchronization Field (SFIELD) which indicated whether that instruction is to be synced to an instruction in a different master. For example, if it were desirable for instruction 1 (INST1) of master P1 to be synced to an instruction 4 (INST4) of master P2, assuming both P1 and P2 have an MPU portion of the type of FIG. 7, the SFIELD1 of P1, and the SFIELD4 OF P2 would be set to a b'110'. This indicate that it is desirable for the instruction INST1 of P1 and the instruction INST4 of P4 to be synchronized by proceeding to dispatch the instructions INST1 and INST4 to their respective execution units. Generally, this will be on the next clock cycle of each relative master. The masters can be synchronous or asynchronous to each other. In addition, the SFIELD portion of each instruction could contain an indicator to wait a specific number of cycles after a valid synchronization has occurred.

If INST1 reaches the dispatch unit 315, the value of SFIELD 1 is provided to a comparator 335 of the sync controller 330, and to the sync bus 160. The comparator receives the current SFIELD information from each of the other bus masters. Since master P1 only specifies that it is to be synced to master P2, the comparator will perform a two way compare between the current SFIELD value of P2 and the current SFIELD value of P1, which is b'110' since INST1 is now in the dispatch unit 315. If INST4 of master P2 has not reached the dispatch unit of its processor P2, and a different value than b'110' is being output, then the compare performed by the sync controller of P1 will fail. This causes the dispatch unit to be disabled from dispatching, or acting upon, the current instruction. When INST4 is loaded into the dispatch unit 315 of its processor, the value b'110' is transmitted on the sync bus 260, causing match to occur by comparator 335. This enables a dispatch of INST1 of master 4. Conversely, in the same manner, master P2 allows for dispatch of INST4.

In another embodiment, only a sync instruction would be used. The sync instruction would contain the value corresponding to SFIELD, and the stall instruction would not be retired until the SFIELD values were in sync as described above. This would add an instruction to the instruction set.

One advantage of the present invention is that it only stalls the dispatch of instructions. Other processor functions continue to operate. For example, processor 200 in FIGS. 3 and 4 has a bus interface unit (BIU) 270 which is capable of monitoring the system bus to look for cache coherency issues. In the prior art, the bus would not be accessible to the BIU once it has encountered a synchronization request. This could prevent the DUT from being tested in a manner consistent with an actual system. The present invention does not freeze the bus, and therefore allows other processor functions not associated with instruction dispatch, to be performed normally while awaiting synchronization.

Figure 8:
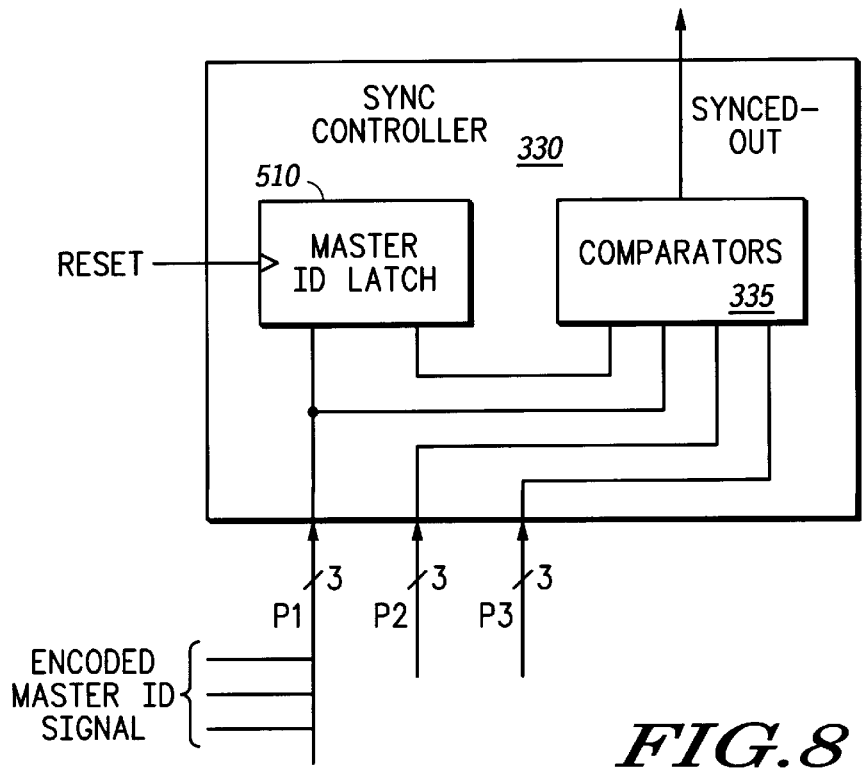
FIG. 8 is a block diagram illustrating a portion of the synch controller of FIG. 5.

FIG. 8 illustrates a training method for sync controller 330. At system start-up, a bus master will not know what its unique identifier is among the bus masters of the system. Therefore it must be "trained". By providing a unique identifier (encoded master ID signal) to each master during start up, such as the group driven by master P1 (see FIG. 6), a unique master ID can be latched into latch 510 during system reset. This programs a unique ID for the bus master based on the hot encoding signals provided. While this is a preferred embodiment, it is not meant to limit other types of training, such as writing a programmable configuration register with information provided from a system bus or other bus.

Figure 9:
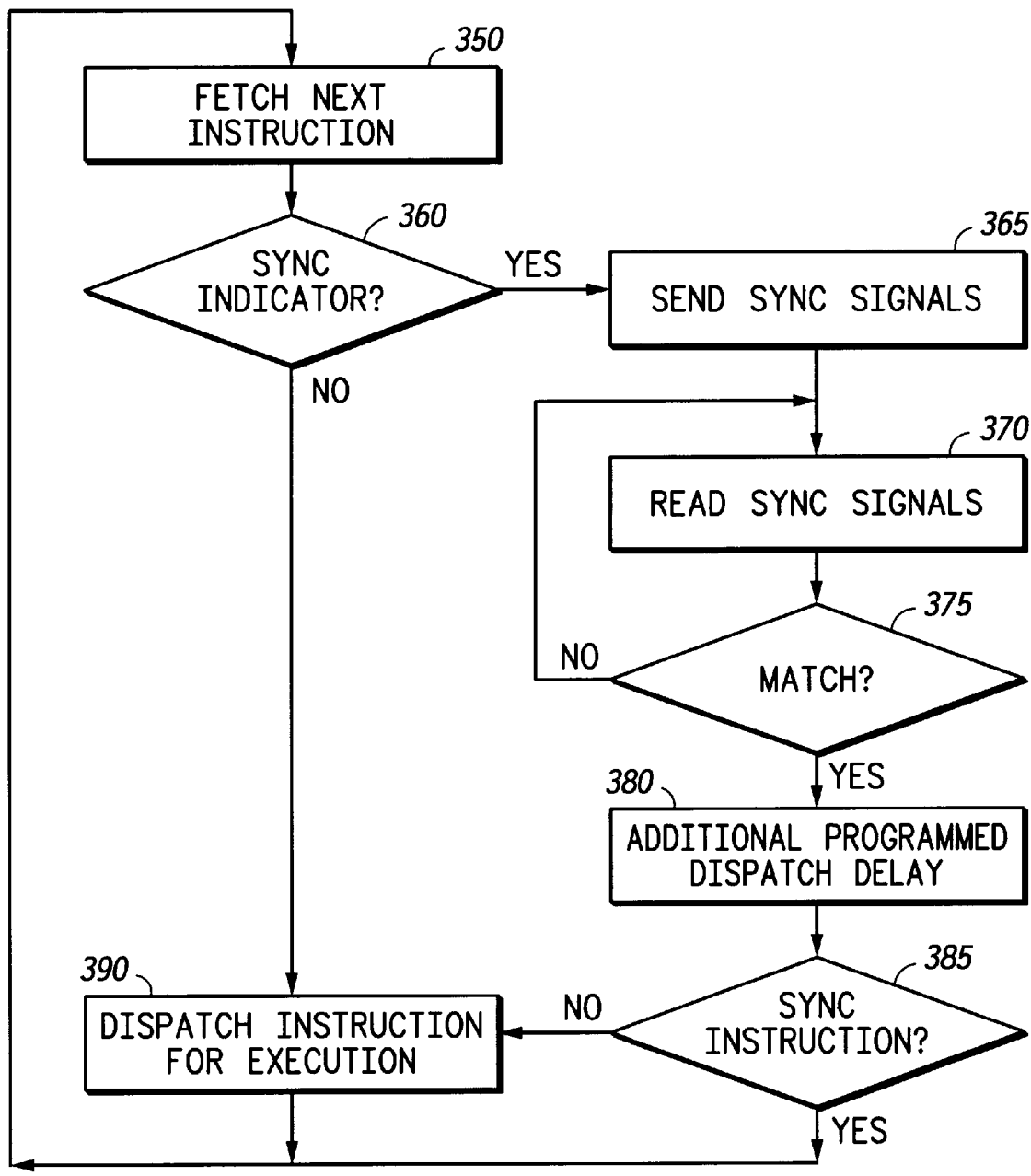
FIG. 9 is a flow chart illustrating operation of the invention for one sync controller.

FIG. 9 is a flow chart illustrating operation of the invention for one sync controller. The next instruction to execute is fetched, step 350. It is tested for a sync indicator, step 360. One embodiment utilizes a sync tag. This is useful in software circuit simulations. Another embodiment utilizes a sync instruction. For example, the PowerPC™ instruction set has a "sync" instruction. It can be extended to specify a sync indication. When nonzero, a sync indication indicates which other masters to sync with.

If a sync indicator is detected in step 360, corresponding sync signals are transmitted on the sync bus, step 365. A loop is then entered where sync signals are read from the sync bus, step 370, and tested for a match against the signals expected for a match, step 375. This repeats until the sync signals received in step 370 match those expected. At this point, a further programmed instruction dispatch delay may be introduced, step 380, in order to allow schmooing input signals to the Device Under Test (DUT) 170. A determination can be made in step 385 whether the sync condition was a result of encountering a sync instruction in step 360. If a sync instruction had been encountered, it need not be executed, and the system continues with fetching the next instruction, step 350. Otherwise, the instruction with the sync indication is dispatched for execution, step 390, before fetching the next instruction, step 350.

Steps 365 through 375 can be seen as a potential stall mechanism stalling instruction dispatch until a programmed delay after the matching sync signals have been received. If a sync indication is not detected in step 360, the stall mechanism is bypassed, and the instruction fetched in step 350 is executed in step 390.

FIGS. 3 through 8 illustrated a hardware or circuit implementation of the invention. The invention may also be implemented in software. This is especially useful when the invention is used to verify timing when testing integrated circuit models for the Device Under Test 170. For example referring back to FIG. 2, DUT 170 can be a software model of a PCI bridge set tested with behavior models for one or more processors P1 110, and P3 130 through Pn 140, and a peripheral bus master P2 120. The sync functionality illustrated above is then implemented as software models incorporated into the behavioral models for P1 110, P2 120, and P3 130, through Pn 140.

Use of such a software model would be integral to the process of designing and implementing the Device Under Test 170 as an integrated circuit (IC). A model of the circuit is derived from a design of the circuit. This can be done with standard software tools. The model is then tested for timing problems using this invention. When timing problems are identified through this testing, changes are made in the circuit design, a model is derived from that new circuit design, and the model is again tested for timing problems. This is repeated until a satisfactory level of quality has been reached. At that point, the circuit design is laid out, masks are made from the layout, and integrated circuits are manufactured from the masks. These later steps are well known in the semiconductor industry.

Figure 10:
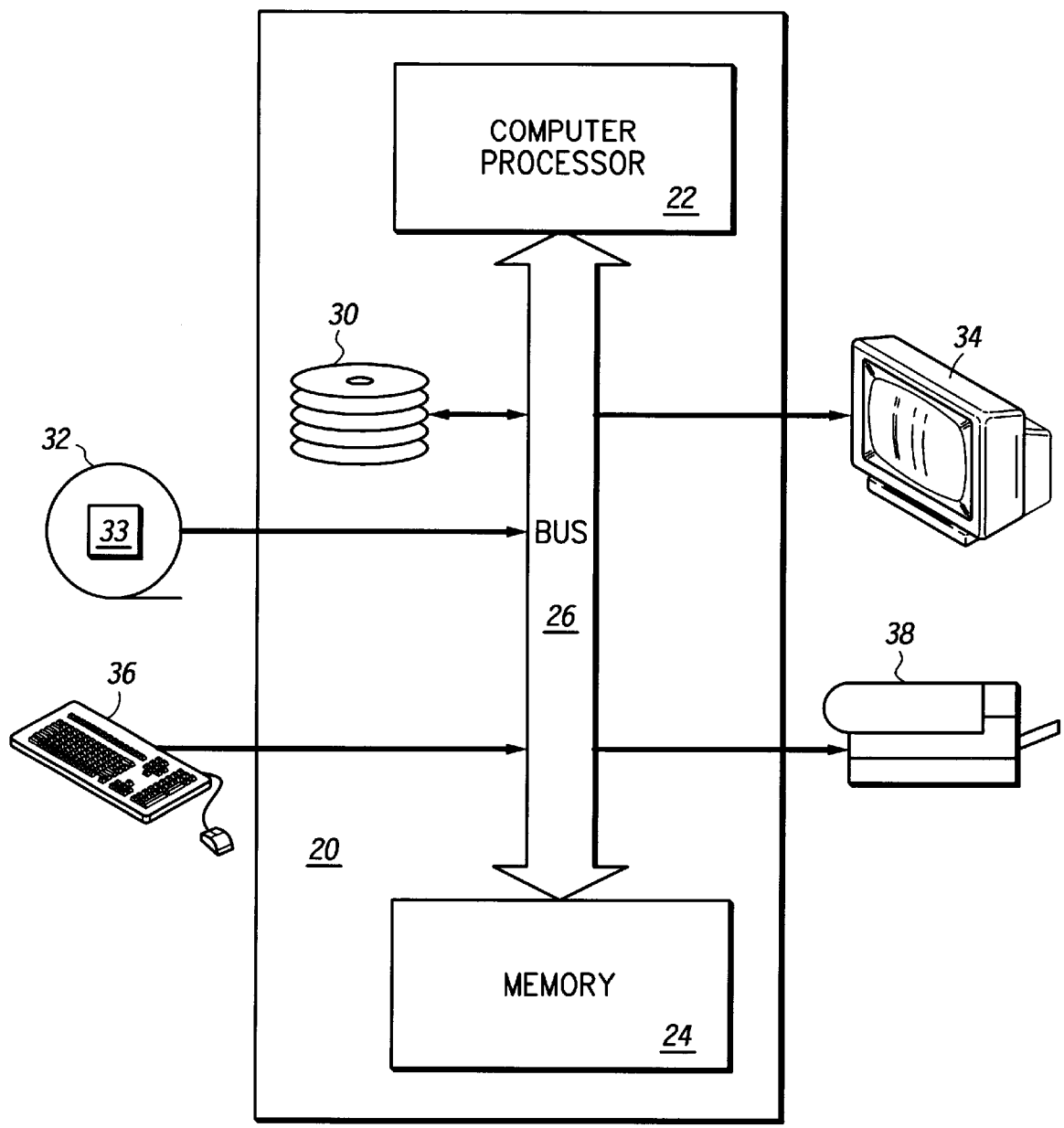
FIG. 10 is a block diagram illustrating a general purpose computer for execution of a software embodiment of this invention.

FIG. 10 is a block diagram illustrating hardware components used in a software implementation of the invention. General Purpose Computer 20 has a Computer Processor 22, and Memory 24, connected by a Bus 26. Memory 24 includes relatively high speed machine readable media such as DRAM, SRAM, ROM, FLASH, EEPROM, and bubble memory. Also connected to the Bus are Secondary Storage 30, External Storage 32, output devices such as a monitor 34, input devices such as a keyboard (with mouse) 36, and printers 38. Secondary Storage 30 includes machine readable media such as hard disk drives, magnetic drum, and bubble memory. External Storage 32 includes machine readable media such as floppy disks, removable hard drives, magnetic tape, CD-ROM, and even other computers, possibly connected via a communications line. The distinction drawn here between Secondary Storage 30 and External Storage 32 is primarily for convenience in describing the invention. As such, it should be appreciated that there is substantial functional overlap between these elements. Executable versions of computer software 33, such as a model of the Device Under Test (DUT) 170 and behavioral models for P1 110, P2 120, and P3 130, through Pn 140 can be read from the External Storage 32 and loaded for execution directly into the Memory 24, or stored on the Secondary Storage 30 prior to loading into Memory 24 and execution.

Those skilled in the art will recognize that modifications and variations can be made without departing from the spirit of the invention. Therefore, it is intended that this invention encompass all such variations and modifications as fall within the scope of the appended claims.

I claim:

1. A method of synchronizing multiple masters, the method comprising:

identifying in a first master a first condition which when met indicates the first master is ready to be synchronized to a second master;

identifying in a second master a second condition which when met indicates the second master is ready to be synchronized to the first master;

identifying in a third master a third condition which when met indicates the third master is ready to be synchronized to the second master;

identifying in a second master a fourth condition which when met indicates the second master is ready to be synchronized to the first master;

satisfying the first condition in the first master and providing a first synch indicator to the second master and the third master indicating the first master is to be synchronized with the second master, wherein instruction dispatch continues in the second master and the third master and instruction dispatch stalls in the first master;

satisfying the third condition in the third master following the step of satisfying the first condition, and providing a third synch indicator to the first master and the second master indicating the third master is to be synchronized with the second master, wherein instruction execution continues in the second master and instruction dispatch stalls in the third master; and satisfying the second condition in the second master and providing a second synch indicator to the first master and the third master indicating the second master is to be synchronized with the first master, wherein instruction execution continues in the first master and the second master, and remains stalled in the third master.

2. The method of claim 1 providing a first synch indicator to the second master includes driving the synch indicator onto a bus connecting the first master to the second master.

3. The method of 1 wherein providing a first synch indicator to the second master includes writing the first synch indicator to a memory location accessible by the second master.

4. The method of claim 1 wherein the first master is a microprocessor.

5. The method of claim 1, wherein the first master is a behavioral model of a microprocessor.

6. The method of claim 1 further comprising the step of:

satisfying the fourth condition in the second master and providing a second synch indicator to the first master and the third master indicating the second master is to be synchronized with the third master, wherein instruction execution continues in the second master and the third master.

* * * * *